(12) United States Patent
Ide et al.

(10) Patent No.: US 9,381,738 B2
(45) Date of Patent: *Jul. 5, 2016

(54) LIQUID JET APPARATUS PERFORMING PULSE MODULATION ON A DRIVE SIGNAL

(71) Applicant: SEIKO EPSON CORPORATION, Tokyo (JP)

(72) Inventors: Noritaka Ide, Shiojiri (JP); Kunio Tabata, Shiojiri (JP); Atsushi Oshima, Shiojiri (JP); Shinichi Miyazaki, Suwa (JP); Hiroyuki Aizawa, Shiojiri (JP); Seiichi Taniguchi, Asahi-mura (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/139,554

(22) Filed: Dec. 23, 2013

(65) Prior Publication Data

US 2014/0111571 A1    Apr. 24, 2014

Related U.S. Application Data

(60) Continuation of application No. 13/743,169, filed on Jan. 16, 2013, now Pat. No. 8,657,399, which is a division of application No. 12/340,895, filed on Dec. 22, 2008, now Pat. No. 8,376,486.

(30) Foreign Application Priority Data

Dec. 25, 2007  (JP) ................................ 2007-331892

(51) Int. Cl.
*B41J 29/38*    (2006.01)
*H03F 3/38*    (2006.01)
*B41J 2/045*    (2006.01)

(Continued)

(52) U.S. Cl.
CPC .......... *B41J 2/04501* (2013.01); *B41J 2/04508* (2013.01); *B41J 2/04541* (2013.01); *B41J 2/04581* (2013.01); *B41J 2/04593* (2013.01);
(Continued)

(58) Field of Classification Search
CPC .......... H03F 3/2175; H03F 3/217; H03K 7/08
See application file for complete search history.

(56) References Cited

U.S. PATENT DOCUMENTS 6,903,945 B2    6/2005  Kitano
7,161,510 B2    1/2007  Sugiyama (Continued)

FOREIGN PATENT DOCUMENTS

JP    02-226815 A    9/1990
JP    10-258718 A    9/1998

(Continued)

*Primary Examiner* — Shelby Fidler
(74) *Attorney, Agent, or Firm* — Maschoff Brennan

(57) ABSTRACT

A liquid jet apparatus according to the present invention includes a drive waveform generator adapted to generate a drive waveform signal, a modulator adapted to execute pulse modulation on the drive waveform signal, a digital power amplifier adapted to power-amplify the modulated signal, on which the pulse modulation is executed by the modulator, with a pair of switching elements push-pull coupled with each other, a low pass filter adapted to smooth the amplified digital signal obtained by the power-amplification of the digital power amplifier, and a modulation period modification circuit adapted to modify a modulation period of the pulse modulation of the modulator based on data of the drive waveform signal.

7 Claims, 14 Drawing Sheets

(51) Int. Cl.
*H03F 3/217* (2006.01)
*H01L 41/04* (2006.01)
*B41J 2/07* (2006.01)

(52) U.S. Cl.
CPC ............... *B41J 2/04596* (2013.01); *B41J 2/07* (2013.01); *H01L 41/042* (2013.01); *H03F 3/2175* (2013.01)

(56) References Cited

U.S. PATENT DOCUMENTS

| | | | |
|---|---|---|---|
| 7,244,007 B2 | 7/2007 | Ishizaki | |
| 7,571,989 B2 | 8/2009 | Ishizaki | |
| 7,656,946 B2 * | 2/2010 | Morishima | 375/238 |
| 7,758,140 B2 | 7/2010 | Oshima et al. | |
| 7,997,671 B2 | 8/2011 | Ishizaki | |
| 8,246,133 B2 | 8/2012 | Oshima et al. | |
| 8,262,180 B2 | 9/2012 | Oshima et al. | |
| 8,657,399 B2 * | 2/2014 | Ide et al. | 347/10 |
| 9,048,792 B2 * | 6/2015 | Yoshino et al. | |
| 2005/0219288 A1 | 10/2005 | Vogeley et al. | |
| 2006/0197561 A1 * | 9/2006 | Lee et al. | 327/131 |
| 2007/0165074 A1 | 7/2007 | Ishizaki | |
| 2008/0018683 A1 | 1/2008 | Oshima et al. | |
| 2008/0018687 A1 | 1/2008 | Tabata et al. | |
| 2008/0143573 A1 | 6/2008 | Luthra | |
| 2009/0303271 A1 | 12/2009 | Tabata et al. | |

FOREIGN PATENT DOCUMENTS

| | | | |
|---|---|---|---|
| JP | 11-291491 A | | 10/1999 |
| JP | 3040767 B1 | | 5/2000 |
| JP | 2001-224169 A | | 8/2001 |
| JP | 2003-237068 A | | 8/2003 |
| JP | 2004-088959 A | | 3/2004 |
| JP | 2004080863 A | * | 3/2004 |
| JP | 2004-345274 A | | 12/2004 |
| JP | 2005-329710 A | | 12/2005 |
| JP | 2006-231882 A | | 9/2006 |
| JP | 2006-256151 A | | 9/2006 |
| JP | 2007-096364 A | | 4/2007 |
| JP | 2007-168172 A | | 7/2007 |
| JP | 2007-190708 A | | 8/2007 |
| JP | 2007-216401 A | | 8/2007 |
| JP | 2008-049698 A | | 3/2008 |
| JP | 2008-049700 A | | 3/2008 |
| JP | 2008-087467 A | | 4/2008 |
| JP | 2008-148288 A | | 6/2008 |

* cited by examiner

LIQUID JET APPARATUS PERFORMING PULSE MODULATION ON A DRIVE SIGNAL

CROSS-REFERENCE TO RELATED APPLICATIONS

This application is a continuation of U.S. patent application Ser. No. 13/743,169, filed Jan. 16, 2013, which is a divisional of U.S. patent application Ser. No. 12/340,895, filed Dec. 22, 2008, which claims priority to Japanese patent application no. 2007-331892, filed Dec. 25, 2007. The foregoing patent applications are incorporated herein by reference.

BACKGROUND

1. Technical Field

The present invention relates to a liquid jet apparatus arranged to form predetermined characters and images by emitting microscopic droplets of liquids from a plurality of nozzles to form the microscopic particles (dots) thereof on a medium.

2. Related Art

Incidentally, in liquid jet printing apparatuses using the liquid jet apparatus, a drive signal amplified by a power amplifying circuit is applied to an actuator such as a piezoelectric element to emit a jet of a liquid from a nozzle, and if the drive signal is amplified by an analog power amplifier such as a linearly driven push-pull coupled transistor, a substantial power loss is caused, and a large heat sink for radiation is required. Therefore, according to JP-A-2005-329710, the drive signal is amplified using a digital power amplifier, thereby reducing the power loss, and eliminating the heat sink.

In the case of power-amplifying the drive signal using the digital power amplifier, it is a common practice to execute pulse modulation on a drive waveform signal acting as the basis for the drive signal, and to execute digital power amplification on the modulated signal. Incidentally, in the case of performing high-quality and high-speed printing with a one-pass operation using a line head printing apparatus, the time required for printing one dot is extremely short. For example, if a piezoelectric element is used as the actuator, it is required to pull in the liquid in the nozzle and then push it out to eject a jet within the short time required for printing a dot, and this requires a drive voltage signal with an accurate trapezoidal waveform. Since the drive waveform signal is as precise as the drive signal, in order for executing accurate pulse modulation on the precise drive waveform signal, it is required to shorten the modulation period, such as the period of a triangular wave for pulse-width modulation, or the sampling period for pulse-density modulation.

However, if the modulation period is too short, an extremely short on-duty pulse or off-duty pulse is generated at the low voltage or the high voltage in the case of, for example, the pulse-width modulation, or an extremely short on-duty or off-duty pulse is generated at an intermediate voltage in the case of, for example, the pulse-density modulation, which causes a problem that the accurate drive signal is not obtained in the case in which the switching element of the digital power amplifier does not respond to the short pulse. It is obvious that if the modulation period is made longer in order for eliminating this problem, the follow-up property to the drive waveform signal is degraded, and therefore, the accurate drive signal is not obtained after all.

SUMMARY

The invention has an object of providing a liquid jet apparatus capable of outputting an accurate drive signal while assuring the follow-up property of the drive signal to a drive waveform signal when performing power-amplification using a digital power amplifier.

A liquid jet apparatus according to the invention has a feature of including a drive waveform generator adapted to generate a drive waveform signal, a modulator adapted to execute pulse modulation on the drive waveform signal, a digital power amplifier adapted to power-amplify the modulated signal, on which the pulse modulation is executed by the modulator, with a pair of switching elements push-pull coupled with each other, a low pass filter adapted to smooth the amplified digital signal obtained by the power-amplification of the digital power amplifier, and a modulation period modification circuit adapted to modify a modulation period of the pulse modulation of the modulator based on data of the drive waveform signal.

The modulation period in the invention denotes a basic unit period of the pulse modulation such as the triangular wave frequency of the pulse-width modulation (PWM) or the sampling frequency of the pulse-density modulation (PDM). It should be noted that the modulation period can be applied to the basic unit period of the pulse modulation in pulse-frequency modulation (PFM) or pulse-phase modulation (PPM).

According to the liquid jet apparatus of the invention, by modifying the modulation period based on the data of the drive waveform signal, it is possible to prevent such short pulses that the switching elements of the digital power amplifier cannot respond to, and at the same time, to assure the follow-up property to the drive waveform signal, thereby outputting the accurate drive signal.

Further, the liquid jet apparatus according to the present invention has a feature that in the case in which the pulse modulation by the modulator is pulse-width modulation, the modulation period modification circuit modifies the modulation period by modifying a frequency of a triangular wave signal of the modulator in accordance with a potential of the drive waveform signal.

Further, the liquid jet apparatus according to the present invention has a feature that the modulation period modification circuit modifies the frequency of the triangular wave signal of the modulator in accordance with a variation in the potential of the drive waveform signal.

Further, the liquid jet apparatus according to the present invention has a feature that in the case in which the pulse modulation by the modulator is pulse-density modulation, the modulation period modification circuit modifies the modulation period by modifying a sampling frequency of the modulator in accordance with a potential of the drive waveform signal.

Further, the liquid jet apparatus according to the present invention has a feature that the modulation period modification circuit modifies the sampling frequency of the modulator in accordance with a variation in the potential of the drive waveform signal.

Further, a liquid jet apparatus according to the invention has a feature of including a drive waveform generator adapted to generate a drive waveform signal, a modulator adapted to execute pulse modulation on the drive waveform signal, a digital power amplifier adapted to power-amplify the modulated signal, on which the pulse modulation is executed by the modulator, with a pair of switching elements push-pull coupled with each other, and a low pass filter adapted to smooth the amplified digital signal obtained by the power-amplification of the digital power amplifier, wherein the drive waveform generator modifies a modulation period of the pulse modulation of the modulator in conjunction with data of the drive waveform signal.

Further, a liquid jet apparatus according to the invention has a feature of including a drive waveform generator adapted to generate a drive waveform signal, a modulator adapted to execute pulse modulation on the drive waveform signal, a digital power amplifier adapted to power-amplify the modulated signal, on which the pulse modulation is executed by the modulator, with a pair of switching elements push-pull coupled with each other, and a low pass filter adapted to smooth the amplified digital signal obtained by the power-amplification of the digital power amplifier, wherein the drive waveform generator stores modulation period data of the pulse modulation in conjunction with data of the drive waveform signal.

Further, the liquid jet apparatus according to the invention has a feature that the drive waveform generator refers to the modulation period data in accordance with the drive waveform signal data.

DESCRIPTION OF EXEMPLARY EMBODIMENTS

A first embodiment of a liquid jet printing apparatus using a liquid jet apparatus of the invention will hereinafter be explained.

Figure 1A:
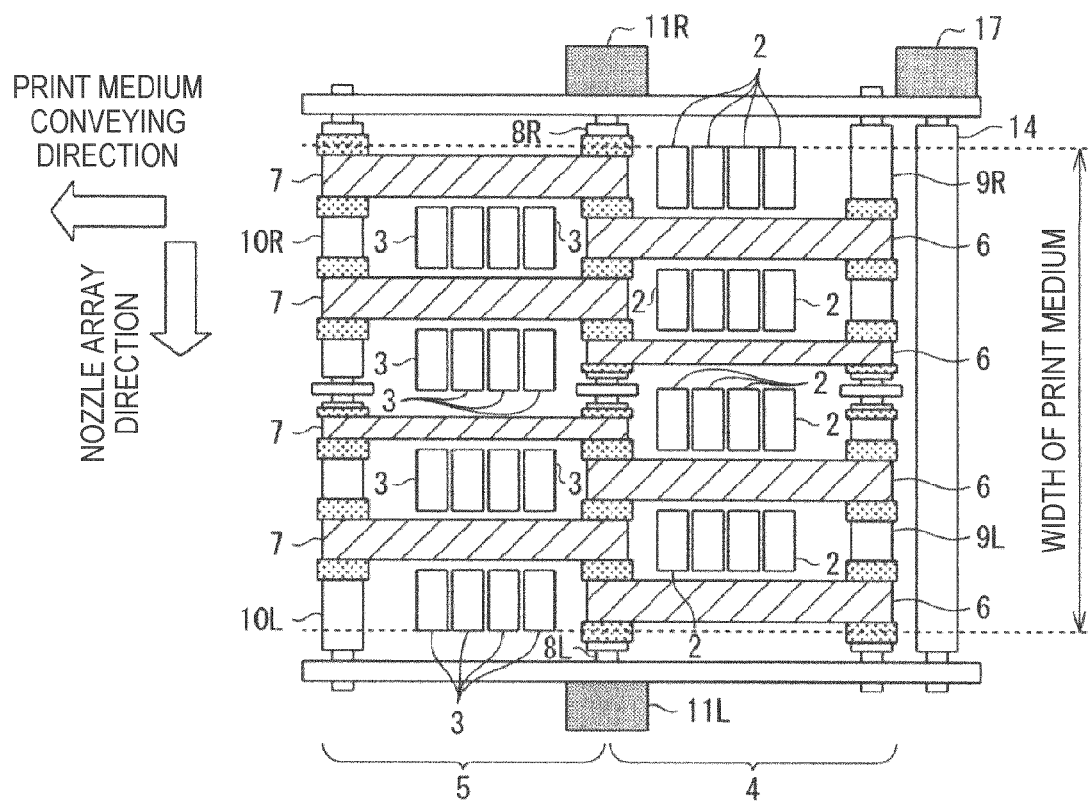
FIG. 1A is a plan view of a schematic configuration of a liquid jet printing apparatus using a liquid jet apparatus according to the invention.
Figure 1B:
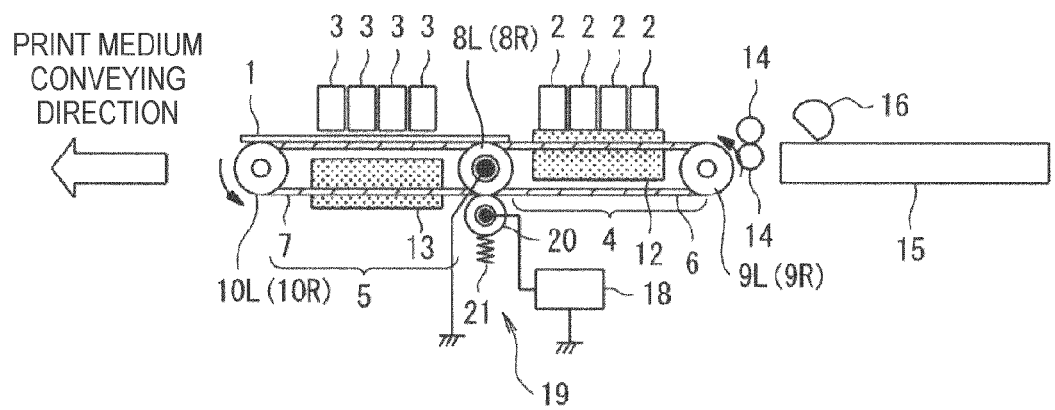
FIG. 1B is a front view of the schematic configuration of the liquid jet printing apparatus using the liquid jet apparatus according to the invention.

FIGS. 1A and 1B are schematic configuration diagrams of the liquid jet printing apparatus according to the first embodiment, wherein FIG. 1A is a plan view thereof, and FIG. 1B is a front view thereof. In FIGS. 1A and 1B, in a line head printing apparatus, a print medium 1 is conveyed from right to left of the drawing along the arrow direction, and is printed in a print area in the middle of the conveying path.

The reference numeral 2 denotes first liquid jet heads disposed on the upstream side of the print medium 1 in the conveying direction, the reference numeral 3 denotes second liquid jet heads disposed similarly on the downstream side, a first conveying section 4 for conveying the print medium 1 is disposed below the first liquid jet heads 2, and a second conveying section 5 is disposed below the second liquid jet heads 3. The first conveying section 4 is composed of four first conveying belts 6 disposed with predetermined intervals in the direction (hereinafter also referred to as a nozzle array direction) traversing the conveying direction of the print medium 1, and the second conveying section 5 is similarly composed of four second conveying belts 7 disposed with predetermined intervals in the direction (the nozzle array direction) traversing the conveying direction of the print medium 1.

The four first conveying belts 6 and the similar four second conveying belts 7 are disposed alternately adjacent to each other. In the first embodiment, among the conveying belts 6, 7, the two first conveying belts 6 and the two second conveying belts 7 on the right side in the nozzle array direction are separated form the two first conveying belts 6 and the two second conveying belts 7 on the left side in the nozzle array direction. In other words, an overlapping portion of the two first conveying belts 6 and the two second conveying belts 7 on the right side in the nozzle array direction is provided with a right side drive roller 8R, an overlapping portion of the two first conveying belts 6 and the two second conveying belts 7 on the left side in the nozzle array direction is provided with a left side drive roller 8L, right side first driven roller 9R and left side first driven roller 9L are disposed on the upstream side thereof, and right side second driven roller 10R and left side second driven roller 10L are disposed on the downstream side thereof. Although these rollers may seem a series of rollers, actually they are decoupled at the center portion of FIG. 1A.

Further, the two first conveying belts 6 on the right side in the nozzle array direction are wound around the right side drive roller 8R and the right side first driven roller 9R, the two first conveying belts 6 on the left side in the nozzle array direction are wound around the left side drive roller 8L and the left side first driven roller 9L, the two second conveying belts 7 on the right side in the nozzle array direction are wound around the right side drive roller 8R and the right side second driven roller 10R, the two second conveying belts 7 on the left side in the nozzle array direction are wound around the left side drive roller 8L and the left side second driven roller 10L, and further, a right side electric motor 11R is coupled to the right side drive roller 8R, and a left side electric motor 11L is coupled to the left side drive roller 8L.

Therefore, when the right side electric motor 11R rotationally drives the right side drive roller 8R, the first conveying section 4 composed of the two first conveying belts 6 on the right side in the nozzle array direction and similarly the second conveying section 5 composed of the two second conveying belts 7 on the right side in the nozzle array direction move in sync with each other and at the same speed, while the left side electric motor 11L rotationally drives the left side drive roller 8L, the first conveying section 4 composed of the two first conveying belts 6 on the left side in the nozzle array direction and similarly the second conveying section 5 composed of the two second conveying belts 7 on the left side in the nozzle array direction move in sync with each other and at the same speed. It should be noted that by arranging the rotational speeds of the right side electric motor 11R and the left side electric motor 11L to be different from each other, the conveying speeds on the left and right in the nozzle array direction can be set to be different from each other, and specifically, by arranging the rotational speed of the right side electric motor 11R to be higher than the rotational speed of the left side electric motor 11L, the conveying speed on the right side in the nozzle array direction can be made higher than that on the left side, and by arranging the rotational speed of the left side electric motor 11L to be higher than the rotational speed of the right side electric motor 11R, the conveying speed on the left side in the nozzle array direction can be made higher than that on the right side. Further, by thus controlling the conveying speeds on the respective sides in the nozzle array direction, namely the direction traversing the conveying direction, it becomes possible to control the conveying posture of the print medium 1.

The first liquid jet heads 2 and the second liquid jet heads 3 are disposed so as to be shifted from each other in the conveying direction of the print medium 1 corresponding respectively to the four colors, such as yellow (Y), magenta (M), cyan (C), and black (K). The liquid jet heads 2, 3 are supplied with liquids such as ink from liquid tanks of respective colors not shown via liquid supply tubes. The liquid jet heads 2, 3 are each provided with a plurality of nozzles formed in the direction traversing the conveying direction of the print medium 1, and by emitting a necessary amount of the liquid jet from the respective nozzles simultaneously to the necessary positions, microscopic dots are formed on the print medium 1. By executing the process described above for each of the colors, one-pass print can be achieved only by making the print medium 1 conveyed by the first and second conveying sections 4, 5 pass therethrough once.

As a method of emitting a liquid jet from each of the nozzles of the liquid jet head, there are cited electrostatic driving method, piezoelectric driving method, film boiling liquid jet method, and so on, and in the first embodiment there is used the piezoelectric driving method. In the piezoelectric driving method, when a drive signal is provided to a piezoelectric element as an actuator, a diaphragm in a cavity is displaced to cause pressure variation in the cavity, and the liquid jet is emitted from the nozzle in response to the pressure variation. Further, by controlling the wave height and the voltage variation gradient of the drive signal, it becomes possible to control the amount of liquid jet to be emitted therefrom. It should be noted that the actuator formed of a piezoelectric element is a capacitive load having a capacitance.

The nozzles of the first liquid jet head 2 are only provided between the four first conveying belts 6 of the first conveying section 4, and the nozzles of the second liquid jet head 3 are only provided between the four second conveying belts 7 of the second conveying section 5. Although this is for cleaning each of the liquid jet heads 2, 3 with a cleaning section described later, in this case, the entire surface is not printed by the one-pass printing if either one of the liquid jet heads is used. Therefore, the first liquid jet heads 2 and the second liquid jet heads 3 are disposed so as to be shifted in the conveying direction of the print medium 1 in order for compensating for each other's unprintable areas.

Below the first liquid jet heads 2, there are disposed first cleaning caps 12 for cleaning the first liquid jet heads 2, and below the second liquid jet heads 3 there are disposed second cleaning caps 13 for cleaning the second liquid jet heads 3. Each of the cleaning caps 12, 13 is formed to have a size allowing the cleaning caps to pass through the gaps between the four first conveying belts 6 of the first conveying section 4 and the gaps between the four second conveying belts 7 of the second conveying section 5. Each of the cleaning caps 12, 13 is composed of a cap body having a rectangular shape with a bottom, covering the nozzles provided to the lower surface, namely a nozzle surface of the liquid jet head 2, 3, and capable of adhering to the nozzle surface, a liquid absorber disposed at the bottom thereof, a peristaltic pump connected to the bottom of the cap body, and an elevating device for moving the cap body up and down. Then, the cap body is moved up by the elevating device to be adhered to the nozzle surface of the liquid jet head 2, 3. By applying the negative pressure in the cap body using the peristaltic pump in the present state, the liquid and bubbles are suctioned from the nozzles opened on the nozzle surface of the liquid jet head 2, 3, thus the cleaning of the liquid jet head 2, 3 can be performed. After the cleaning is completed, each of the cleaning caps 12, 13 is moved down.

On the upstream side of the first driven rollers 9R, 9L, there is provided a pair of gate rollers 14 for adjusting the feed timing of the print medium 1 fed from a feeder section 15 and at the same time correcting the skew of the print medium 1. The skew denotes a turn of the print medium 1 with respect to the conveying direction. Further, above the feeder section 15, there is provided a pickup roller 16 for feeding the print medium 1. It should be noted that the reference numeral 17 denotes a gate roller motor for driving the gate rollers 14.

A belt charging device 19 is disposed below the drive rollers 8R, 8L. The belt charging device 19 is composed of charging rollers 20 each having contact with the first conveying belts 6 and the second conveying belts 7 by pinching the first conveying belts 6 and the second conveying belts 7 between the charging rollers and the drive rollers 8R, 8L, a spring 21 for pressing the charging rollers 20 against the first conveying belts 6 and the second conveying belts 7, and a power supply 18 for providing charge to the charging rollers 20, and charges the first conveying belts 6 and the second conveying belts 7 by providing the first conveying belts 6 and the second conveying belts 7 with the charge. Since the belts are generally made of a moderate or high resistivity material or an insulating material, when they are charged by the belt charging device 19, the charge applied on the surface thereof causes the dielectric polarization on the print medium 1 made similarly of a high resistivity material or an insulating material, and the print medium 1 can be absorbed to the belt by the electrostatic force caused between the charge generated by the dielectric polarization and the charge on the surface of the belt. It should be noted that as the belt charging means, a corotron method for showering the charges can also be used.

Therefore, according to the liquid jet printing apparatus using the liquid jet apparatus of the first embodiment, when the surfaces of the first conveying belts 6 and the second conveying belts 7 are charged by the belt charging device 19, the print medium 1 is fed from the gate roller 14 in that state, and the print medium 1 is pressed against the first conveying belts 6 by a sheet pressing roller not shown, the print medium 1 is absorbed by the surfaces of the first conveying belts 6 under the action of dielectric polarization described above. In this state, when the electric motors 11R, 11L rotationally drive the drive rollers 8R, 8L, the rotational drive force is transmitted to the first driven rollers 9R, 9L via the first conveying belts 6.

Thus, while the first conveying belts 6 are moved to the downstream side in the conveying direction with the print medium 1 absorbed thereto to move the print medium 1 below the first liquid jet heads 2, printing is performed by emitting liquid jets from the nozzles provided to the first liquid jet heads 2. When the printing by the first liquid jet heads 2 is completed, the print medium 1 is moved towards downstream side in the conveying direction to be transferred to the second conveying belts 7 of the second conveying section 5. As described above, since the second conveying belts 7 are also provided with the charge on the surfaces thereof by the belt charging device 19, the print medium 1 is absorbed by the surfaces of the second conveying belts 7 under the action of the dielectric polarization described above.

In this state, while the second conveying belts 7 is moved towards the downstream side in the conveying direction to move the print medium 1 below the second liquid jet heads 3, printing is performed by emitting liquid jets from the nozzles provided to the second liquid jet heads 3. After the printing by the second liquid jet heads 3 is completed, the print medium 1 is moved further to the downstream side in the conveying direction, the print medium 1 is ejected to a catch tray while separating it from the surfaces of the second conveying belts 7 by a separating device not shown in the drawings.

Further, when the cleaning of the first and second liquid ejection heads 2, 3 is necessary, the first and second cleaning caps 12, 13 are raised to be adhered to the nozzle surfaces of the first and second liquid jet heads 2, 3 as described above, the cleaning is performed by applying negative pressure to the inside of the caps at that state to suction the liquid and bubbles from the nozzles of the first and second liquid jet heads 2, 3, and after then, the first and second cleaning caps 12, 13 are moved down.

Figure 2:
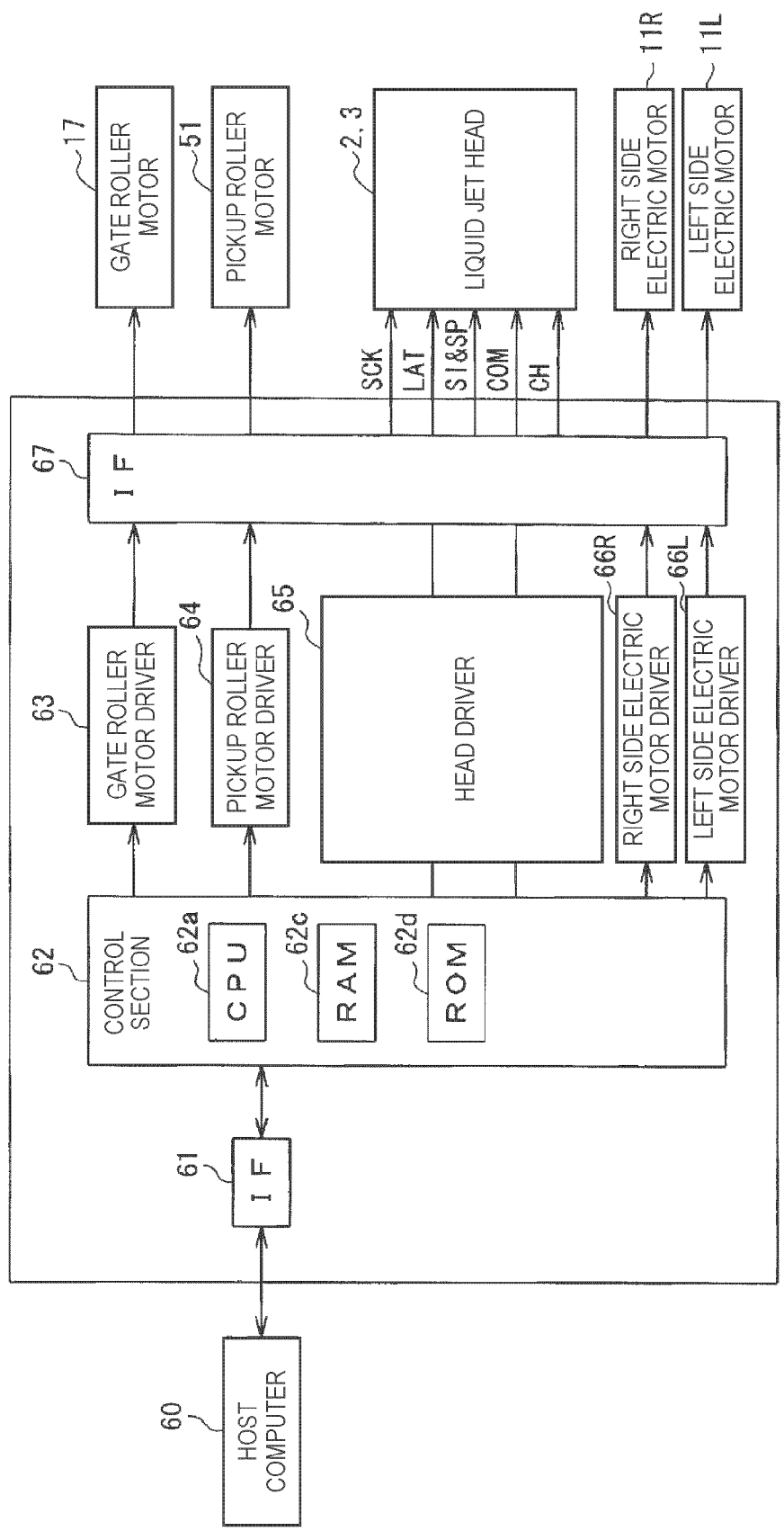
FIG. 2 is a block diagram of a control device of the liquid jet printing apparatus.

In the liquid jet printing apparatus using the liquid jet apparatus of the first embodiment, there is provided a control device for controlling the liquid jet printing apparatus. As shown in FIG. 2, the control device is configured including an input interface 61 for receiving print data input from the host computer 60, a control section 62 formed of a microcomputer for performing the print process based on the print data input from the input interface 61, a gate roller motor driver 63 for controlling and driving the gate roller motor 17, a pickup roller motor driver 64 for controlling and driving a pickup roller motor 51 for driving the pickup roller 16, a head driver 65 for controlling and driving the liquid jet heads 2, 3, a right side electric motor driver 66R for controlling and driving the right side electric motor 11R, a left side electric motor driver 66L for controlling and driving the left side electric motor 11L, and an interface 67 for connecting the gate roller motor driver 63, the pickup roller motor driver 64, the head driver 65, the right side electric motor driver 66R, and the left side electric motor driver 66L respectively to the gate roller motor 17, the pickup roller motor 51, the liquid jet heads 2, 3, the right side electric motor 11R, and the left side electric motor 11L.

The control section 62 is provided with a central processing unit (CPU) 62a for performing various processes such as a printing process, a random access memory (RAM) 62c for temporarily stores the print data input via the input interface 61 and various kinds of data used in performing the printing process of the print data, and for temporarily developing a program, for example, for the printing process, and a read-only memory (ROM) 62d formed of a nonvolatile semiconductor memory and for storing, for example, the control program executed by the CPU 62a. When the control section 62 receives the print data (the image data) from the host computer 60 via the input interface 61, the CPU 62a executes a predetermined process on the print data to calculate nozzle selection data and drive signal output data to the nozzle actuators regarding which nozzle emits the liquid jet or how much liquid jet is emitted, and outputs the drive signals and the control signals to the gate roller motor driver 63, the pickup roller motor driver 64, the head driver 65, the right side electric motor driver 66R, and the left side electric motor driver 66L, respectively, based on the print data, drive signal output data, and the input data from the various sensors. In response to the drive signals and the control signals, the actuators 22 corresponding to the plurality of nozzles of the liquid jet heads 2, 3, the gate roller motor 17, the pickup roller motor 51, the right side electric motor 11R, and the left side electric motor 11L respectively operate to execute the feeding and conveying of the print medium 1, the posture control of the print medium 1, and the printing process on the print medium 1. It should be noted that the constituents inside the control section 62 are electrically connected to each other via a bus not shown in the drawings.

Figure 3:
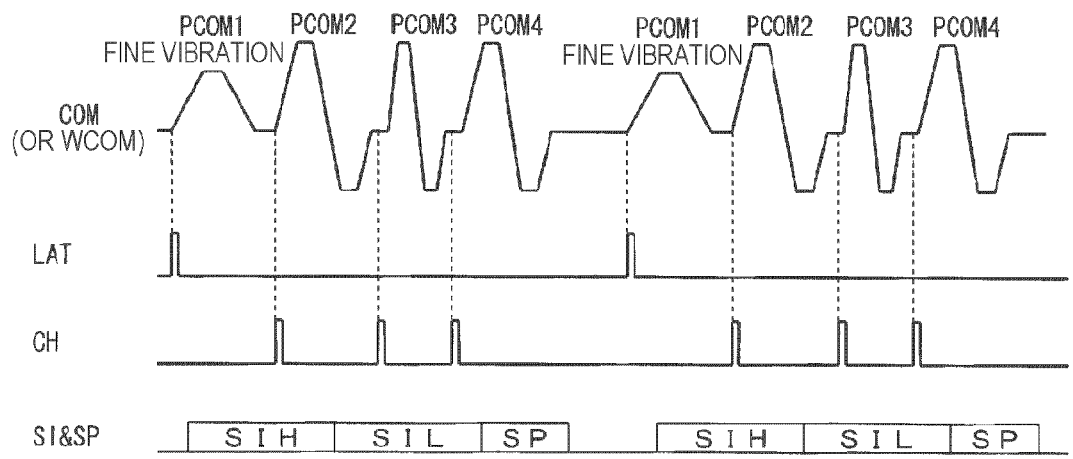
FIG. 3 is an explanatory diagram of a drive signal for driving an actuator.

FIG. 3 shows an example of a drive signal COM supplied from the control device of the liquid jet printing apparatus using the liquid jet apparatus according to the first embodiment to the liquid jet heads 2, 3 and for driving the actuators 22 each formed of a piezoelectric element. In the first embodiment, the signal is assumed to be a signal with the electric potential varying around a midpoint potential. The drive signal COM is formed by connecting drive pulses PCOM as unit drive signals for driving the actuator 22 so as to emit a liquid jet in a time-series manner, wherein the rising section of each of the drive pulses PCOM corresponds to a stage of expanding the volume of the cavity (the pressure chamber) communicating with the nozzle to pull in the liquid (it can also be said that the meniscus is pulled in, in view of the surface of the liquid to be emitted), the falling section of each of the drive pulses PCOM corresponds to a stage of reducing the volume of the cavity to push out the liquid (it can also be said that the meniscus is pushed out, in view of the surface of the liquid to be emitted), and as a result of pushing out the liquid, the liquid jet is emitted from the nozzle.

By variously modifying the gradient of increase and decrease in voltage and the height of the drive pulse PCOM formed of this trapezoidal voltage wave, the pull-in amount and the pull-in speed of the liquid, and the push-out amount and the push-out speed of the liquid can be modified, thus the amount of liquid jet can be varied to obtain the liquid dots with different sizes. Therefore, in the case in which a plurality of drive pulses PCOM are sequentially joined, it is possible to select the single drive pulse PCOM from the drive pulses to be supplied to the actuator to emit the liquid jet, or to select the two or more drive pulses PCOM to be supplied to the actuator to emit the liquid jet two or more times, thereby obtaining the dots with various sizes. In other words, when the two or more liquid droplets land on the same position before the liquid is dried, it brings substantially the same result as emitting a larger amount of liquid jet, thus the size of the dot can be enlarged. By a combination of such technologies, it becomes possible to achieve multiple tone printing. It should be noted that the drive pulse PCOM1 shown in the left end of FIG. 3 is only for pulling in the liquid without pushing out the liquid. This is called a fine vibration, and is used for preventing thickening in the nozzle without emitting the liquid jet.

As a result of the above, in the liquid jet head 2, 3 there are input the drive signal COM output from the drive signal output circuit described later, the drive pulse selection data SI & SP for selecting the nozzle to emit the liquid jet and determining the coupling timing of the actuator 22 such as a piezoelectric element to the drive signal COM based on the print data, the latch signal LAT and a channel signal CH for coupling the drive signals COM with the actuators 22 of the liquid jet head 2, 3 to each other based on the drive pulse selection data SI & SP after the nozzle selection data is input to all of the nozzles, and the clock signal SCK for transmitting the drive pulse selection data SI & SP to the liquid jet head 2, 3 as a serial signal. It should be noted that it is hereinafter assumed that the minimum unit of the drive signal for driving the actuator 22 is the drive pulse PCOM, and the entire signal having the drive pulses PCOM coupled with each other in a time series manner is described as the drive signal COM.

Figure 4:
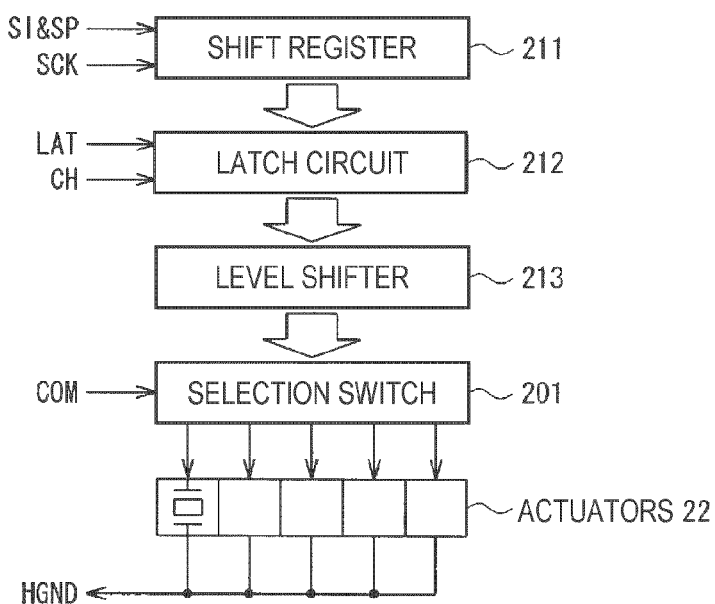
FIG. 4 is a block diagram of a selection section for coupling the drive signal with the actuator.

Then, the configuration of coupling the drive signals COM output from the drive circuit with the actuators 22 such as a piezoelectric element will be explained. FIG. 4 is a block diagram of the selection section for coupling the drive signals COM with the actuators such as the piezoelectric element. The selection section is composed of a shift register 211 for storing the drive pulse selection data SI & SP for designating the actuator 22 such as a piezoelectric element corresponding to the nozzle from which the liquid jet is to be emitted, a latch circuit 212 for temporarily storing the data of the shift register 211, a level shifter 213 for executing level conversion on the output of the latch circuit 212, and a selection switch 201 for coupling the drive signal COM with the actuator 22 such as a piezoelectric element in accordance with the output of the level shifter.

The drive pulse selection data SI & SP is sequentially input to the shift register 211, and at the same time, the storage area is sequentially shifted from the first stage to the subsequent stage in accordance with the input pulse of the clock signal SCK. The latch circuit 212 latches the output signals of the shift register 211 in accordance with the latch signal LAT input thereto after the drive pulse selection data SI & SP corresponding to the number of the nozzles is stored in the shift register 211. The signals stored in the latch circuit 212 are converted to have the voltage levels capable of switching on and off the selection switch 201 on the subsequent stage by the level shifter 213. This is because the drive signal COM has a high voltage compared to the output voltage of the latch circuit 212, and the operating voltage range of the selection switch 210 is also set to be higher accordingly. Therefore, the actuator 22 such as piezoelectric element the selection switch 201 of which is closed by the level shifter 213 is coupled with the drive signal COM (the drive pulse PCOM) at the coupling timing of the drive pulse selection data SI & SP. Further, after the drive pulse selection data SI & SP of the shift register 211 is stored in the latch circuit 212, the subsequent print information is input to the shift register 211, and the stored data of the latch circuit 212 is sequentially updated at the liquid jet emission timing. It should be noted that the reference symbol HGND denotes the ground terminal for the actuator 22 such as the piezoelectric element. Further, according to the selection switch 201, even after the actuator 22 such as the piezoelectric element is separated from the drive signal COM (the drive pulse PCOM), the input voltage of the actuator 22 is maintained at the voltage immediately before it is separated.

Figure 5:
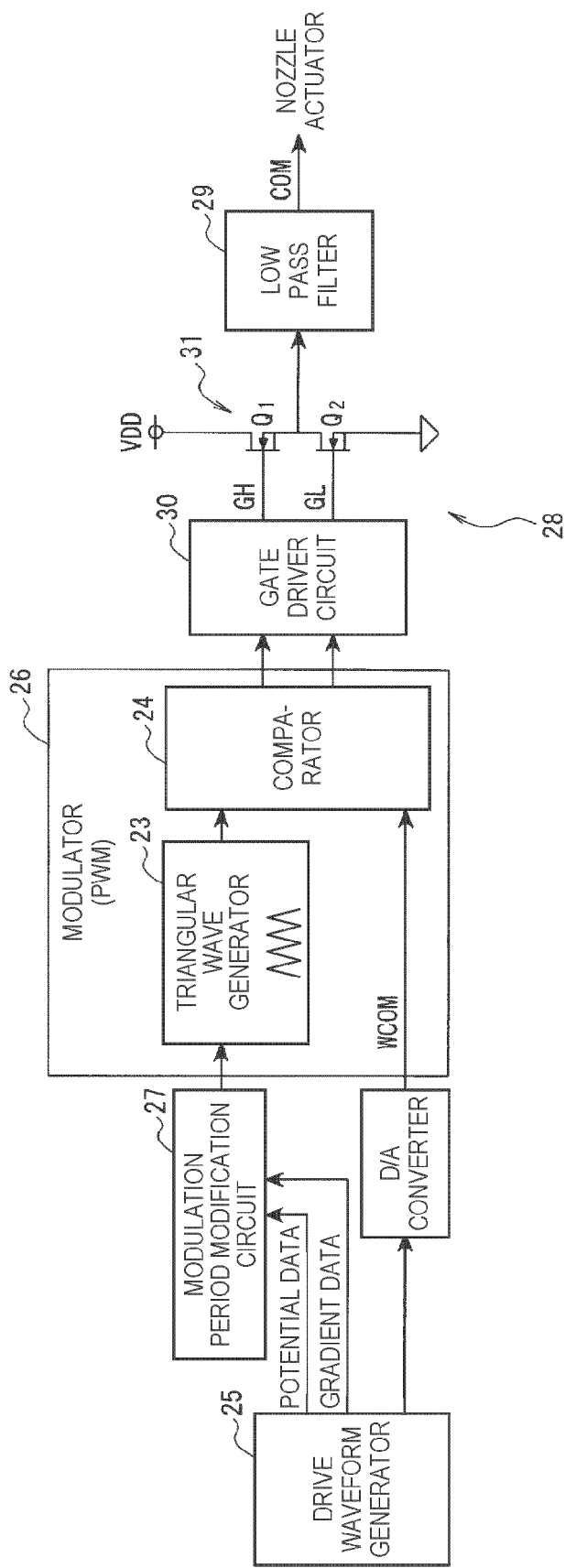
FIG. 5 is a block diagram showing a first embodiment of a drive signal output circuit built up in the head driver shown in FIG. 2.

FIG. 5 shows an example of a specific configuration of the drive signal output circuit in the head driver 65 for driving the actuator 22. The drive signal output circuit is configured including a drive waveform generator 25 for generating a drive waveform signal WCOM forming a base of the drive signal COM (the drive pulse PCOM), namely a basis of a signal for controlling driving of the actuators 22 based on the drive signal output data from the control section 62, a modulator 26 for executing pulse modulation on the drive waveform signal WCOM generated by the drive waveform generator 25, a digital power amplifier 28 for power-amplifying the modulated signal on which the pulse modulation is executed by the modulator 26, and a low pass filter 29 for smoothing the amplified digital signal power-amplified by the digital power amplifier 28 and supplying the actuators 22 with the amplified digital signal thus smoothed as the drive signal COM (the drive pulse PCOM).

The drive waveform generator 25 combines predetermined digital electric potential data in a time-series manner and output the combined predetermined digital electric potential data, and further executes analog conversion thereon with a D/A converter to output it as the drive waveform signal WCOM. In the first embodiment, as the modulator 26 for performing the pulse modulation on the drive waveform signal WCOM, there is used a typical pulse width modulation (PWM) circuit. In the pulse width modulation, the triangular wave generator 23 generates a triangular wave signal with a predetermined frequency, and a comparator 24 compares the triangular wave signal with the drive waveform signal WCOM to output a pulse signal taking on-duty when, for example, the drive waveform signal WCOM is greater than the triangular wave signal, as the modulated signal. The digital power amplifier 28 is configured including a half-bridge output stage 31 formed of a high-side switching element $Q_1$ and a low-side switching element $Q_2$ for substantially amplifying the power, and a gate driver circuit 30 for controlling gate-source signals GH, GL of the switching elements $Q_1$, $Q_2$ based on the modulated signal from the modulator 26. Further, the low pass filter 29 is formed of a low pass filter composed of a combination of inductors and capacitances, and the low pass filter eliminates the modulation period component of the amplified digital signal, namely the frequency component of the triangular wave signal in this case.

In the digital power amplifier 28, when the modulated signal is in an Hi level, the gate-source signal GH of the high-side switching element $Q_1$ becomes in the Hi level and the gate-source signal GL of the low-side switching element $Q_2$ becomes in an Lo level, and consequently, the high-side switching element $Q_1$ becomes in the ON state and the low-side switching element $Q_2$ becomes in the OFF state, and as a result, the output of the half-bridge output stage 31 becomes to have the power supply voltage VDD. On the other hand, when the modulated signal is in the Lo level, the gate-source signal GH of the high-side switching element $Q_1$ becomes in the Lo level and the gate-source signal GL of the low-side switching element $Q_2$ becomes in the Hi level, and consequently, the high-side switching element $Q_1$ becomes in the OFF state and the low-side switching element $Q_2$ becomes in the ON state, and as a result, the output of the half-bridge output stage 31 becomes 0.

Although a current flows through the switching element in the ON state when the high-side and low-side switching elements $Q_1$, $Q_2$ are driven digitally as described above, the resistance value between the drain and the source is extremely small, and therefore, only a little loss is caused. Further, since no current flows in the switching element in the OFF state, the power loss does not occur. Therefore, since the loss of the digital power amplifier 28 is extremely small, a switching element such as a small-sized MOSFET can be used therefor, and cooling means such as a heat radiation plate for cooling can also be eliminated. Incidentally, the efficiency in the case in which the transistor is driven in the linear range is about 30% while the efficiency of digital power amplifier 28 is 90% or higher. Further, since the heat radiation plate for cooling the transistor requires about 60 mm square in size for each transistor, if such a radiation plate for cooling can be eliminated, an overwhelming advantage in the actual layout can be obtained.

Figure 6:
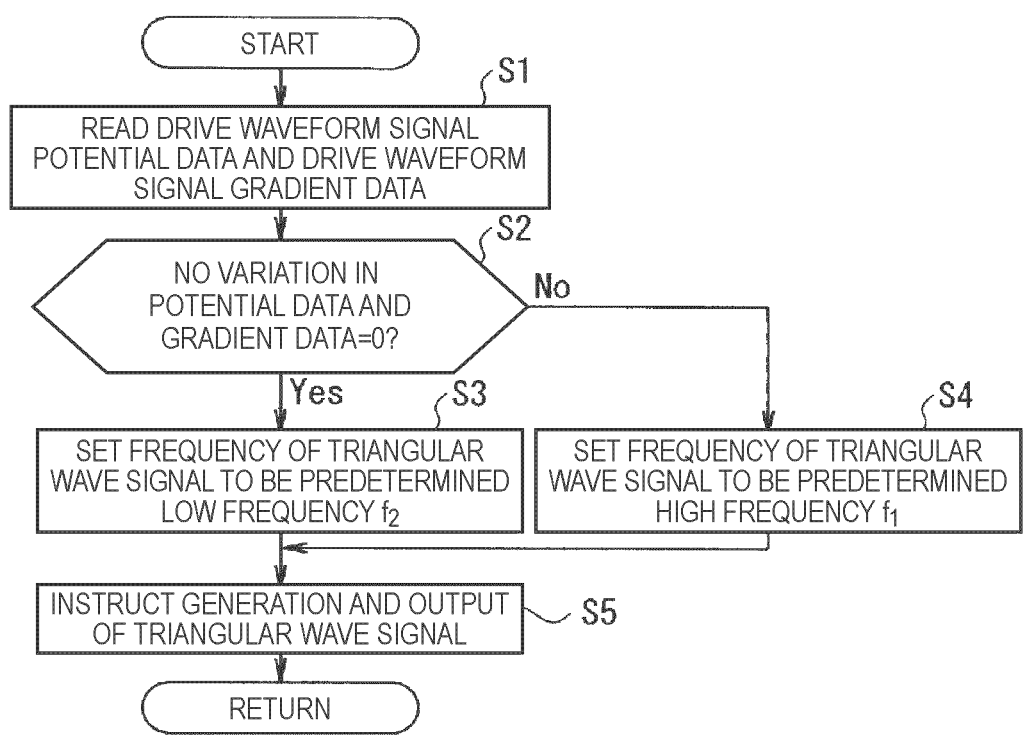
FIG. 6 is a flowchart of arithmetic processing executed in a modulation period modification circuit shown in FIG. 5.

The frequency of the triangular wave signal generated by the triangular wave signal generator 23, namely the modulation period can be modified and set by a modulation period modification circuit 27. In the modulation period modification circuit 27, the arithmetic processing shown in FIG. 6 is executed in a predetermined cycle. In the arithmetic processing shown in FIG. 6, potential data of the drive waveform signal and gradient data of increase and decrease in the potential are read firstly in the step S1.

Then, the process proceeds to the step S2, and whether or not there is no variation in the potential data of the drive waveform signal and at the same time the gradient data is 0 is determined, and if there is no variation in the potential data of the drive waveform signal and at the same time the gradient data is 0, the process proceeds to the step S3, otherwise the process proceeds to the step S4.

In the step S3, the frequency of the triangular wave signal is set to be a predetermined low frequency $f_2$, and the process proceeds to the step S5.

On the other hand, in the step S4, the frequency of the triangular wave signal is set to be a predetermined high frequency $f_1$, and the process proceeds to the step S5.

In the step S5, an instruction of generating and then outputting the triangular wave signal with the frequency set in the step S3 or the step S4 is output to the triangular wave signal generator 23, and the process returns to the main program.

Figure 7:
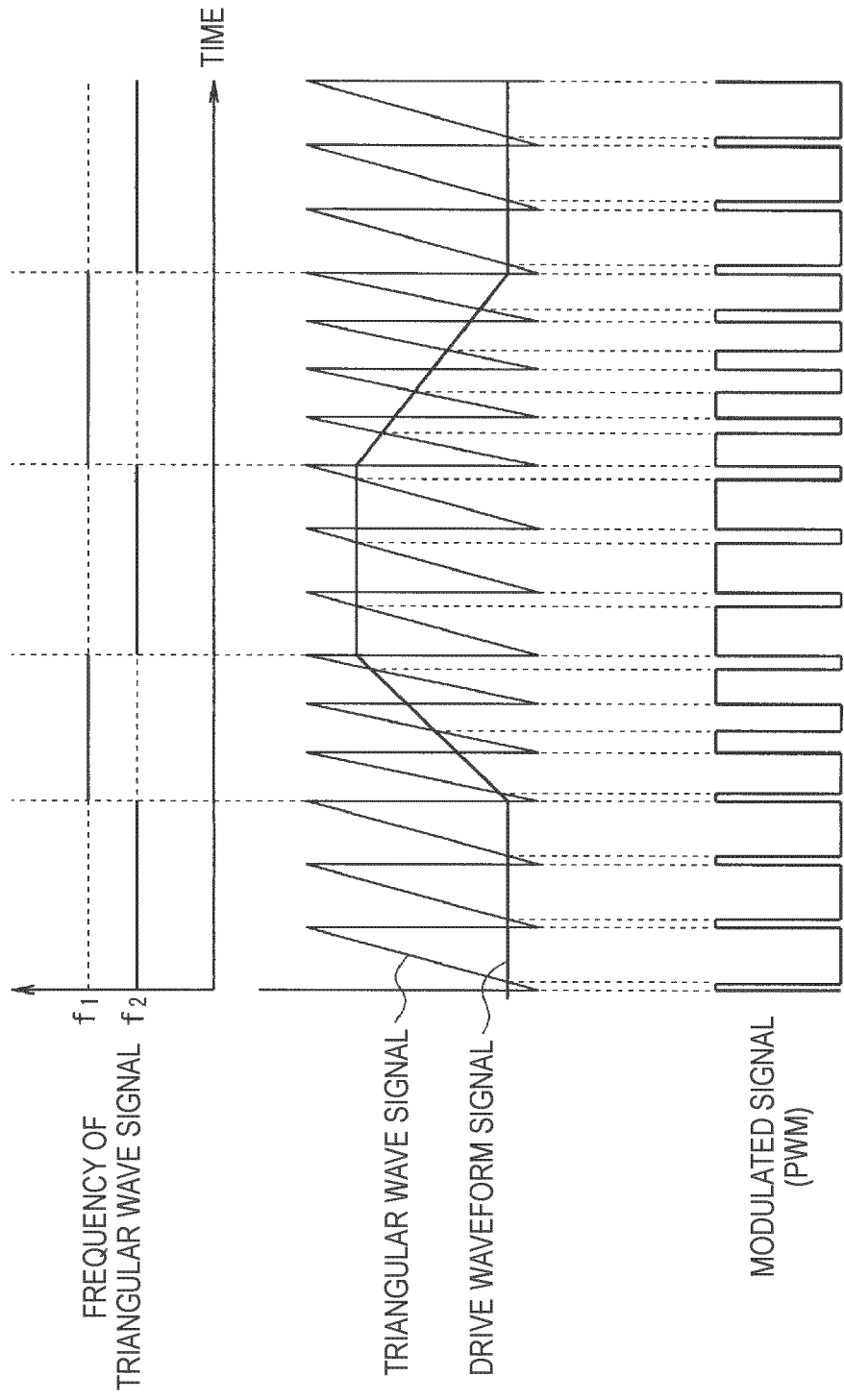
FIG. 7 is an explanatory diagram of a modulated signal by the arithmetic processing shown in FIG. 6.

FIG. 7 shows temporal variations of the drive waveform signal, the triangular wave signal, and the modulated signal (PWM) in the first embodiment. As the drive waveform signal, the drive pulses for the fine vibration described above are used. The modulated signal (PWM) corresponds to the gate-source signal GH to the high-side switching element $Q_1$ of the digital power amplifier 28. In the first embodiment, since the frequency of the triangular wave signal is modified in accordance with the condition of the variation in the potential of the drive waveform signal, specifically the frequency of the triangular wave signal is set to be the predetermined high frequency $f_1$ in the case in which the potential of the drive waveform signal varies, and the frequency of the triangular wave signal is set to be the predetermined low frequency $f_2$ in the case in which the potential of the drive waveform signal does not vary, even if the potential is the same, the pulse width of the modulated signal (PWM) in the case in which the potential of the drive waveform signal varies has the narrow on-duty and the narrow off-duty, and the pulse width of the modulated signal (PWM) in the case in which the potential of the drive waveform signal does not vary has the large on-duty and the large off-duty. If the frequency of the triangular wave signal, namely a so-called carrier frequency is high, the follow-up property to the drive waveform signal becomes high. On the other hand, if the pulse width is large, the on-duty and the off-duty do not easily exceed the response limit of the switching elements $Q_1$, $Q_2$ of the digital power amplifier 28.

Figure 8:
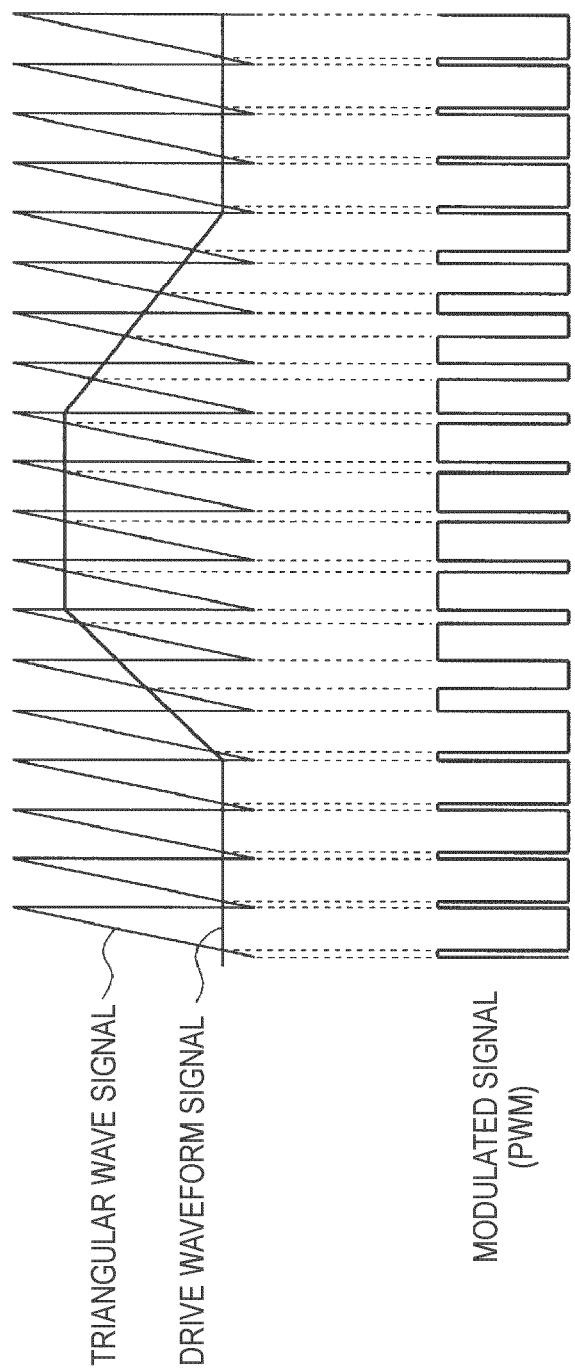
FIG. 8 is an explanatory diagram of the modulated signal in a drive signal output circuit of the related art.

FIG. 8 shows the modulated signal (PWM) when setting the frequency of the triangular wave signal to be constantly the predetermined high frequency $f_1$ in order for assuring the follow-up property of the pulse modulation with respect to the drive waveform signal. In this case, although there arises no problem in the follow-up property of the pulse modulation when the potential of the drive waveform signal varies, in the case in which the drive waveform signal is constantly at a low potential, the on-duty pulse width is extremely narrow, and in the case in which the drive waveform signal is constantly in a high potential, the off-duty pulse width is extremely narrow. If such pulses with the narrow width exceed the response limit of the switching elements $Q_1$, $Q_2$ of the digital power amplifier 28, the switching elements are not accurately switched on and off, and therefore, the drive signal output therefrom does not become what is obtained by accurately power-amplifying the drive waveform signal.

Figure 9:
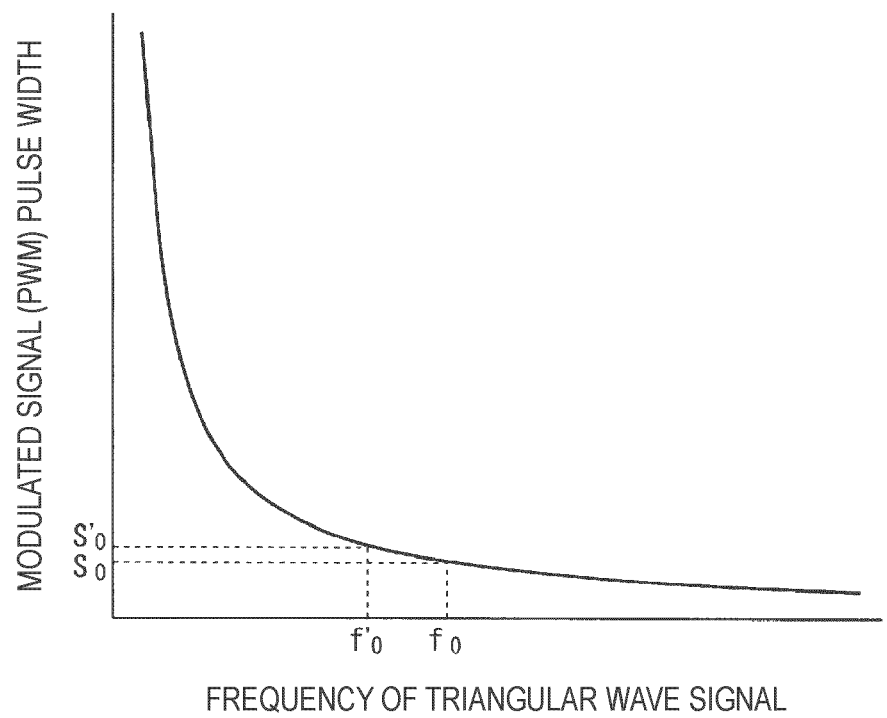
FIG. 9 is an explanatory diagram for setting the frequency of a triangular wave signal.

For example, a relationship between the frequency of the triangular wave signal and the on-duty or off-duty pulse width of the modulated signal (PWM) in the case in which the potential of the drive waveform signal is at a certain level is as shown in FIG. 9, and if the pulse width $S_0$ of the modulated signal (PWM) when the frequency of the triangular wave signal is $f_0$ exceeds the response limit of the switching elements $Q_1$, $Q_2$ of the digital power amplifier 28, it is required to set the frequency $f'_0$ corresponding to the pulse width $S'_0$ of the modulated signal (PWM) not exceeding the response limit of the switching elements $Q_1$, $Q_2$ of the digital power amplifier 28 as the frequency of the triangular wave signal. What is set in the manner as described above is the predetermined low frequency $f_2$ described above.

As described above, according to the liquid jet apparatus of the first embodiment, since there is adopted the configuration in which the drive waveform generator 25 generates the drive waveform signal to be the basis for driving the actuators 22 for emitting the liquid jet, the modulator 26 executes the pulse modulation on the drive waveform signal, the pair of push-pull coupled switching elements of the digital power amplifier 28 power-amplifies the modulated signal, and the modulation period modification circuit 27 modifies the modulation period of the pulse modulation based on the data of the drive waveform signal when smoothing the amplified digital signal with the low pass filter 29 and outputting it to the actuator 22, it is possible to prevent such short pulses that the switching elements $Q_1$, $Q_2$ of the digital power amplifier 28 cannot respond to, and at the same time, to assure the follow-up property to the drive waveform signal by making the modulation period longer when the potential of the drive waveform signal does not vary, and shorter when the potential of the drive waveform signal varies, thereby outputting the accurate drive signals.

Further, since there is adopted the configuration of modifying the frequency of the triangular wave signal of the modulator in accordance with the condition of the variation in the potential of the drive waveform signal in the case in which the pulse modulation by the modulator is the pulse-width modulation, it is easy to put the invention into practice.

Further, since there is adopted the configuration of making the triangular wave frequency lower when the potential of the drive waveform signal does not vary, and making the frequency of the triangular wave signal of the modulator higher when the potential of the drive waveform signal varies, it is possible to prevent such short pulses that the switching elements $Q_1$, $Q_2$ of the digital power amplifier 28 cannot respond to, and at the same time, to assure the follow-up property to the drive waveform signal.

Figure 10:
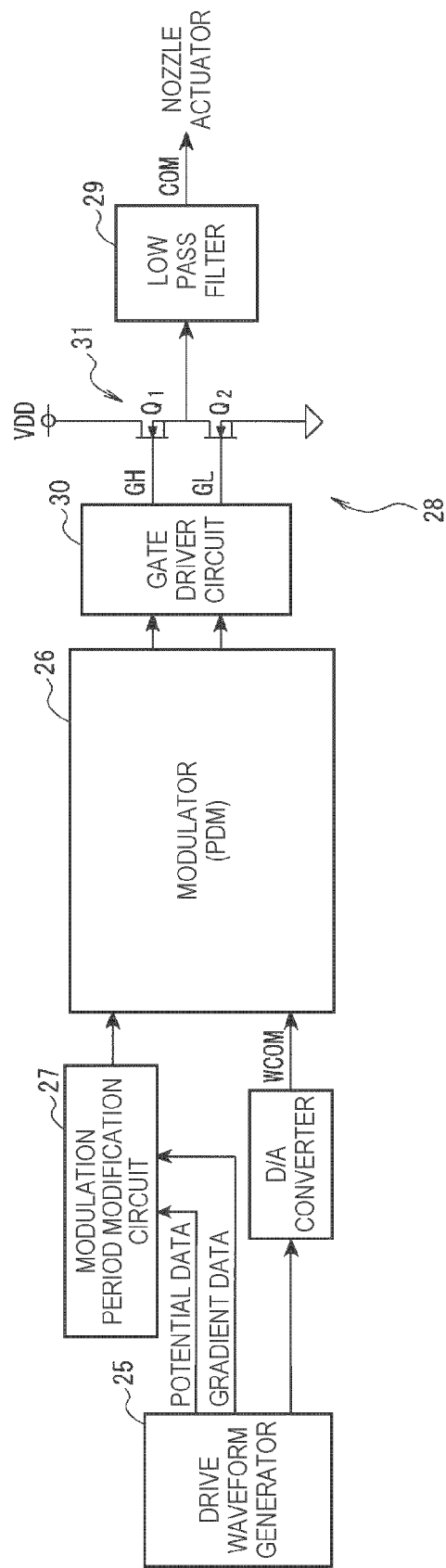
FIG. 10 is a block diagram showing a second embodiment of the drive signal output circuit built up in the head driver shown in FIG. 2.

Then, as a second embodiment applying the liquid jet apparatus of the invention to the liquid jet printing apparatus, another example of the specific configuration of the drive signal output circuit in the head driver 65 for driving the actuators 22 is shown in FIG. 10. FIG. 10 includes a number of constituents identical to those of the configuration shown in FIG. 5, and since those constituents essentially have substantially the same functions, the equivalent constituents are denoted with the equivalent numeral references, and the detailed explanations therefor will be omitted. It is assumed that the drive signal output circuit, namely the drive waveform generator 25, the digital power amplifier 28, and the low pass filter 29 of the second embodiment, have equivalent functions to those shown in FIG. 5 of the first embodiment.

Figure 11:
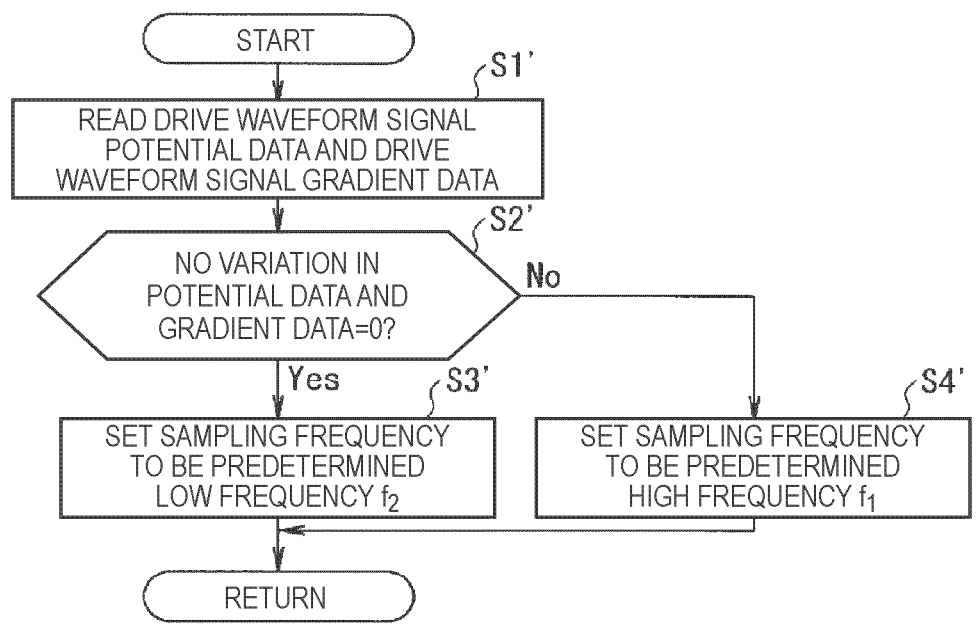
FIG. 11 is a flowchart of arithmetic processing executed in a modulation period modification circuit shown in FIG. 10.

In the second embodiment, a pulse-density modulation (PDM) circuit is used as the modulator 26. The pulse density modulator is for performing a well-known ΔΣ modulation at a predetermined sampling period, thereby performing modulation in a manner that the higher the potential is, the larger the width of the modulated pulse becomes. Therefore, the modulation period modification circuit 27 modifies the sampling period of the pulse density modulation executed in the modulator 26. In the modulation period modification circuit 27, the arithmetic processing shown in FIG. 11 is executed in a predetermined cycle. In the arithmetic processing shown in FIG. 11, the potential data of the drive waveform signal and the gradient data of increase and decrease in the potential are read firstly in the step S1'.

Then, the process proceeds to the step S2', and whether or not there is no variation in the potential data of the drive waveform signal and at the same time the gradient data is 0 is determined, and if there is no variation in the potential data of the drive waveform signal and at the same time the gradient data is 0, the process proceeds to the step S3', otherwise the process proceeds to the step S4'.

In the step S3', the sampling frequency of the pulse density modulation is set to be the predetermined low frequency $f_2$, and then the process returns to the main program.

On the other hand, in the step S4', the sampling frequency of the pulse density modulation is set to be the predetermined high frequency $f_1$, and then the process returns to the main program.

Figure 12:
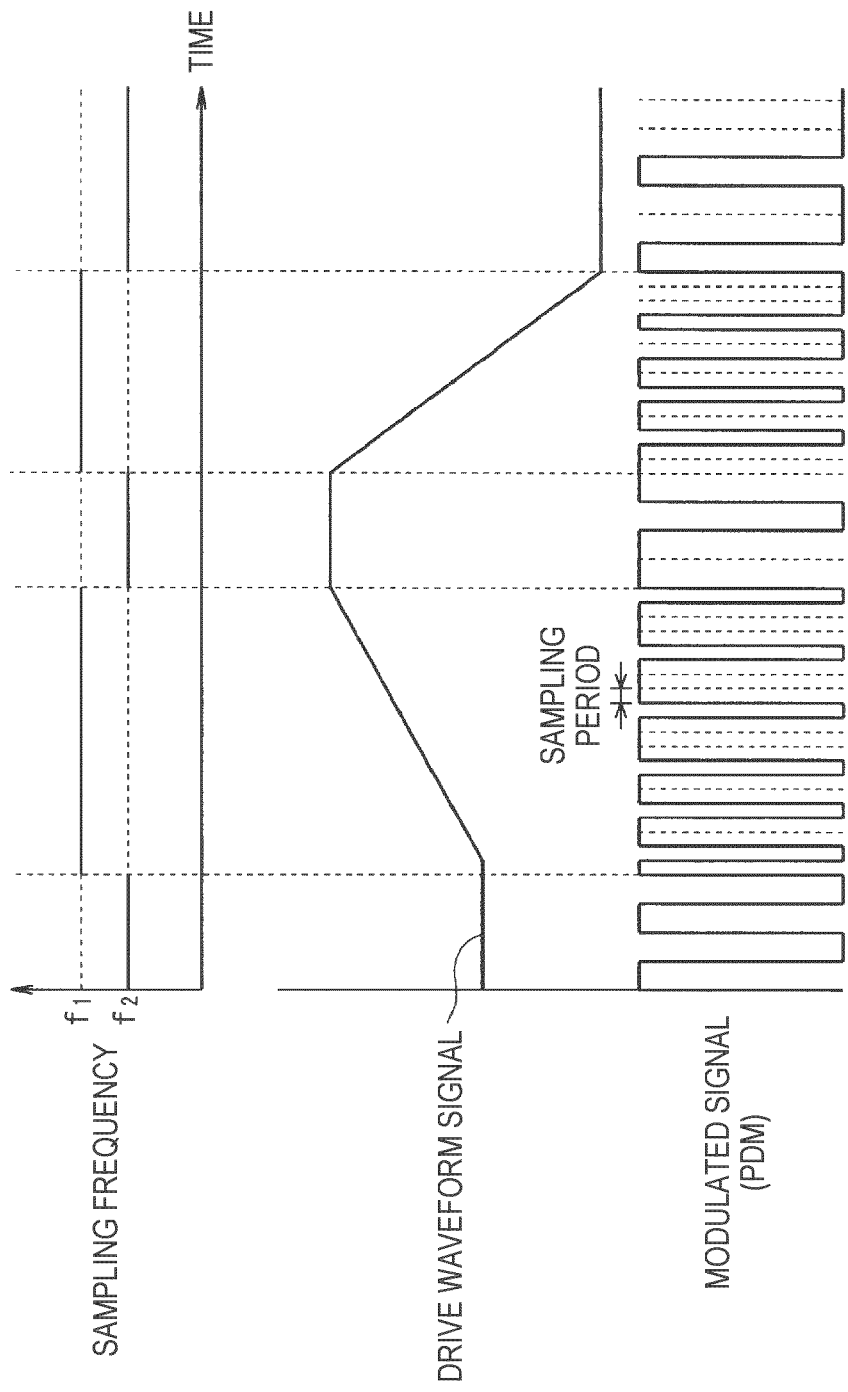
FIG. 12 is an explanatory diagram of a modulated signal by the arithmetic processing shown in FIG. 11.

FIG. 12 shows temporal variations of the sampling frequency of the pulse-density modulation, the drive waveform signal, and the modulated signal (PDM) in the second embodiment. As the drive waveform signal, the normal drive pulses described above are used. The start potential of the normal drive pulse is an intermediate potential. The modulated signal (PDM) corresponds to the gate-source signal GH to the high-side switching element $Q_1$ of the digital power amplifier 28. In the second embodiment, since the sampling frequency of the pulse-density modulation is modified in accordance with the condition of the variation in the potential of the drive waveform signal, specifically the sampling frequency is set to be the predetermined high frequency $f_1$ in the case in which the potential of the drive waveform signal varies, and the sampling frequency is set to be the predetermined low frequency $f_2$ in the case in which the potential of the drive waveform signal does not vary, providing the potential is the same, either one of the on-duty and the off-duty of the pulse width of the modulated signal (PDM) in the case in which the potential of the drive waveform signal varies is narrow, and either one of the on-duty and the off-duty of the pulse width of the modulated signal (PDM) in the case in which the potential of the drive waveform signal does not vary is large. The higher the sampling frequency is, the higher the follow-up property to the drive waveform signal becomes.

Figure 13:
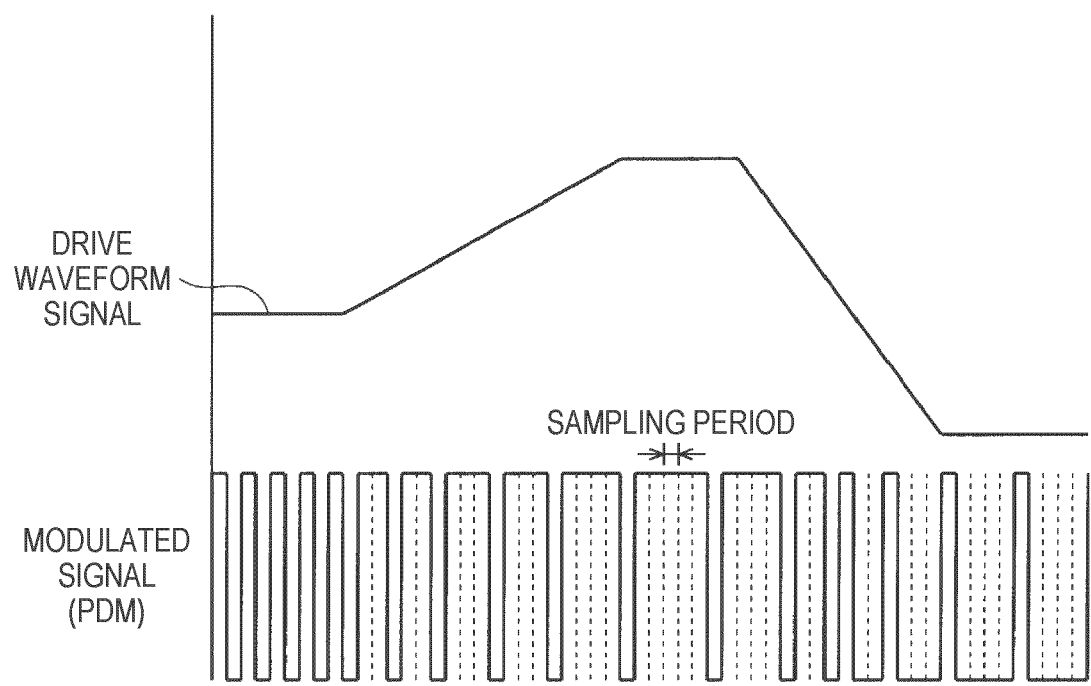
FIG. 13 is an explanatory diagram of the modulated signal in a drive signal output circuit of the related art.

FIG. 13 shows the modulated signal (PDM) when setting the sampling frequency to be constantly the predetermined high frequency $f_1$ in order for assuring the follow-up property of the pulse modulation with respect to the drive waveform signal. In this case, although there arises no problem in the follow-up property of the pulse modulation when the potential of the drive waveform signal varies, the pulse width is extremely narrow in both of the on-duty and the off-duty when the drive waveform signal is constantly in an intermediate potential. In other words, the pitch of the pulses is extremely short. If such pulses with the narrow width and the short pitch exceed the response limit of the switching elements $Q_1$, $Q_2$ of the digital power amplifier 28, the switching elements are not accurately switched on and off, and therefore, the drive signal output therefrom does not become what is obtained by accurately power-amplifying the drive waveform signal. Therefore, in such a case, it is required to set the sampling frequency in the intermediate potential to be the predetermined low frequency $f_2$ in the same manner as shown in FIG. 8 of the first embodiment.

As described above, according to the liquid jet apparatus of the second embodiment, since there is adopted the configuration of modifying the sampling frequency of the modulator 26 in accordance with the condition of the variation in the potential of the drive waveform signal WCOM in the case in which the pulse modulation by the modulator 26 is the pulse-density modulation, thereby modifying the modulation period, it is easy to put the invention into practice.

Further, since there is adopted the configuration of modifying the sampling frequency of the modulator in accordance with the potential of the drive waveform signal, it is possible to prevent such short pulses that the switching elements $Q_1$, $Q_2$ of the digital power amplifier 28 cannot respond to, and at the same time, to assure the follow-up property to the drive waveform signal.

Figure 14:
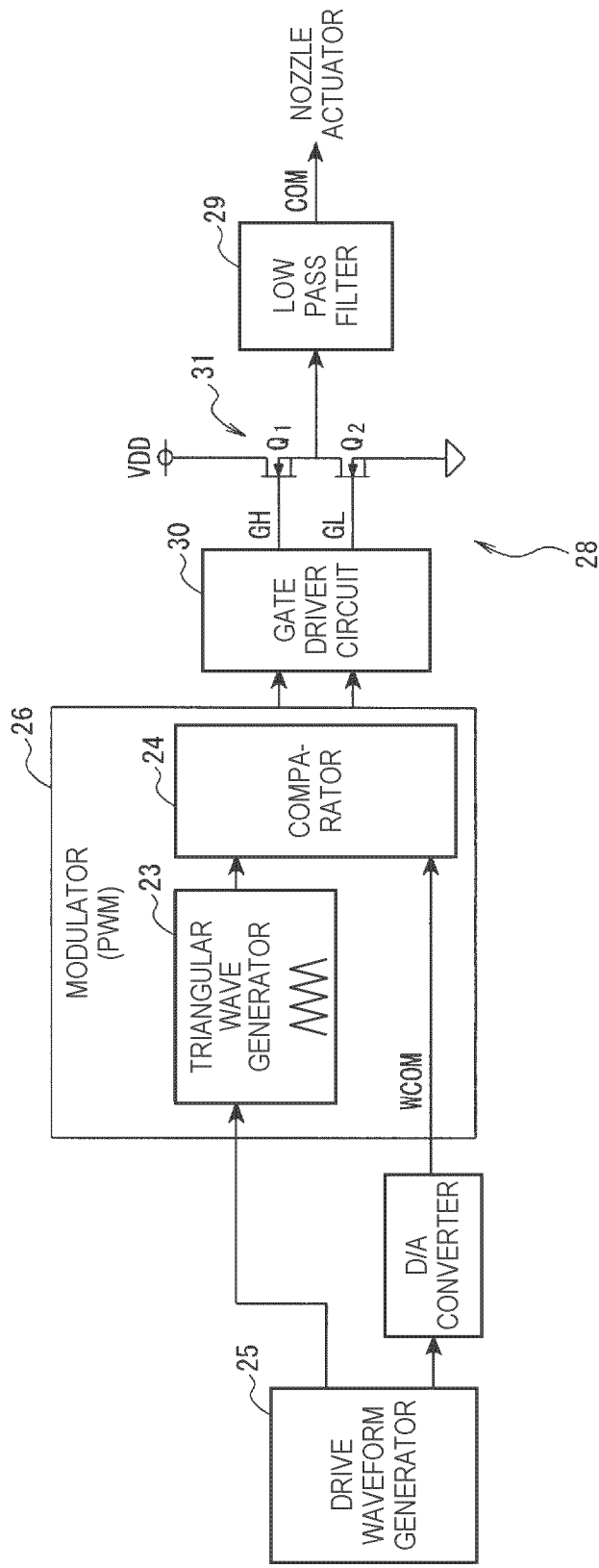
FIG. 14 is a block diagram showing a third embodiment of the drive signal output circuit built up in the head driver shown in FIG. 2.

Then, as a third embodiment applying the liquid jet apparatus of the invention to the liquid jet printing apparatus, another example of the specific configuration of the drive signal output circuit in the head driver 65 for driving the actuators 22 is shown in FIG. 14. FIG. 14 includes a number of constituents identical to those of the configuration shown in FIG. 5, and since those constituents essentially have substantially the same functions, the equivalent constituents are denoted with the equivalent numeral references, and the detailed explanations therefor will be omitted. It is assumed that the drive signal output circuit, namely the modulator 26, the digital power amplifier 28, and the low-pass filter 29 of the third embodiment, have equivalent functions to those shown in FIG. 5 of the first embodiment.

In the third embodiment, there is adopted a configuration in which the drive waveform generator 25 stores frequency data of the triangular wave signal of the triangular wave generator 23 in the modulator 26 in conjunction with the digital electric potential data of the drive waveform signal WCOM, and outputs the frequency data to the triangular wave generator 23 in sync with the digital electric potential data of the drive waveform signal WCOM. Similarly to the first embodiment, the frequency data of the triangular wave signal is arranged so that the modulation period is set with modification by raising the frequency of the triangular wave signal when the potential of the drive waveform signal WCOM varies. The operation by the third embodiment is equivalent to that of the first embodiment described above.

Figure 15:
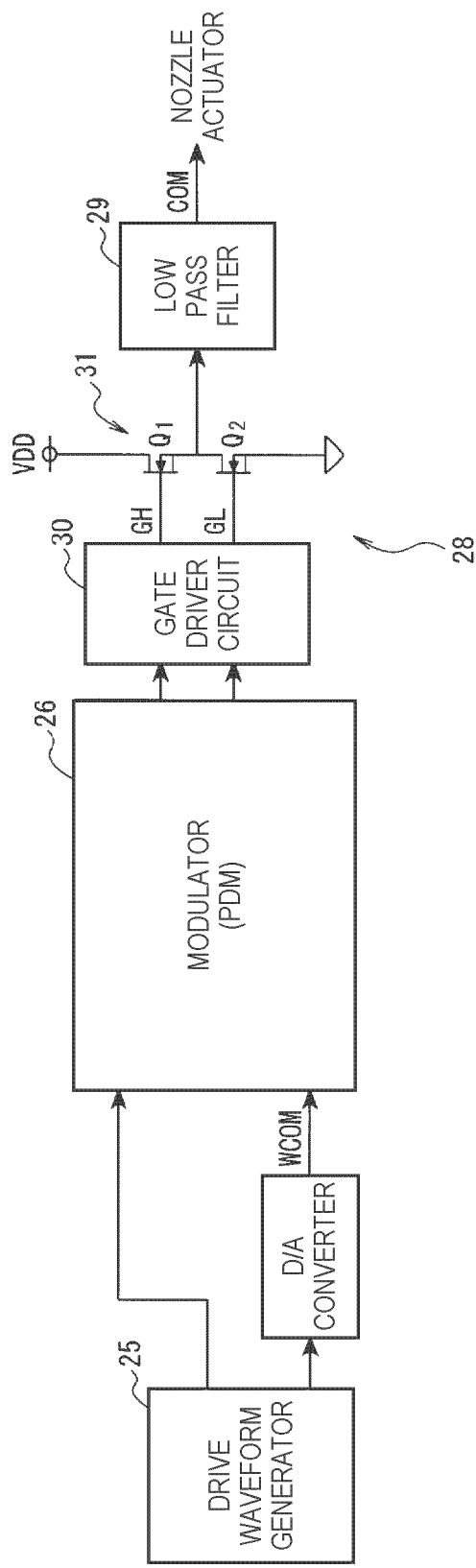
FIG. 15 is a block diagram showing a fourth embodiment of the drive signal output circuit built up in the head driver shown in FIG. 2.

Then, as a fourth embodiment applying the liquid jet apparatus of the invention to the liquid jet printing apparatus, another example of the specific configuration of the drive signal output circuit in the head driver 65 for driving the actuators 22 is shown in FIG. 15. The drawing includes a number of constituents identical to those of the configuration shown in FIG. 10, and since those constituents essentially have substantially the same functions, the equivalent constituents are denoted with the equivalent numeral references, and the detailed explanations therefor will be omitted. It is assumed that the drive signal output circuit, namely the modulator 26, the digital power amplifier 28, and the low-pass filter 29 of the fourth embodiment, have equivalent functions to those shown in FIG. 10 of the second embodiment.

In the fourth embodiment, there is adopted a configuration in which the drive waveform generator 25 stores sampling frequency data of the pulse-density modulation executed in the modulator 26 in conjunction with the digital electric potential data of the drive waveform signal WCOM, and outputs the frequency data to the modulator 26 in sync with the digital electric potential data of the drive waveform signal WCOM. Similarly to the second embodiment, the sampling frequency data is arranged so that the modulation period is set with modification by raising the sampling frequency when the potential of the drive waveform signal WCOM varies. The operation by the fourth embodiment is equivalent to that of the second embodiment described above.

As described above, according to the liquid jet apparatus of the fourth embodiment, since there is adopted the configuration in which the drive waveform generator 25 generates the drive waveform signal to be the basis for driving the actuators 22 for emitting the liquid jet, the modulator 26 executes the pulse modulation on the drive waveform signal, the pair of push-pull coupled switching elements of the digital power amplifier 28 power-amplifies the modulated signal, and the drive waveform generator 25 modifies the modulation period of the pulse modulation by the modulator 26 in conjunction with the data of the drive waveform signal when smoothing the amplified digital signal with the low pass filter 29 and outputting it to the actuator 22, it is possible to prevent such short pulses that the switching elements $Q_1$, $Q_2$ of the digital power amplifier 28 cannot respond to, and at the same time, to assure the follow-up property to the drive waveform signal by modifying the modulation period when the potential of the drive waveform signal varies, thereby outputting the accurate drive signals.

Further, since the drive waveform generator is arranged to have the configuration of storing the modulation period data of the pulse modulation in conjunction with the data of the drive waveform signal, it becomes easy to configure the apparatus, and it is easy to put the invention into practice.

Further, since there is adopted the configuration in which the drive waveform generator stores the modulation data having the shorter modulation period when the potential of the drive waveform signal varies, it is possible to prevent such short pulses that the switching elements $Q_1$, $Q_2$ of the digital power amplifier 28 cannot respond to, and at the same time, to assure the follow-up property to the drive waveform signal.

It should be noted that although in the embodiments described hereinabove the modulation period is modified to be the two levels, the high frequency and the low frequency, the modification of the modulation period is not limited thereto, but the modulation period can be arranged to be variably modified in accordance with, for example, the condition of the variation in the drive waveform signal.

Further, although in each of the embodiments described above only the case in which the liquid jet apparatus of the invention is applied to the line head-type printing apparatus is described in detail, the liquid jet apparatus of the invention can also be applied to multi-pass printing apparatuses in a similar manner.

Further, the liquid jet apparatus of the invention can also be embodied as a liquid jet apparatus for emitting a jet of a liquid (including a liquid like member dispersing particles of functional materials, and a fluid such as a gel besides liquids) other than the ink, or a fluid (e.g., a solid substance capable of flowing as a fluid and being emitted as a jet) other than liquids. The liquid jet device can be, for example, a liquid jet apparatus for emitting a jet of a liquid including a material such as an electrode material or a color material used for manufacturing a liquid crystal display, an electroluminescence (EL) display, a plane emission display, or a color filter in a form of a dispersion or a solution, a liquid jet apparatus for emitting a jet of a living organic material used for manufacturing a biochip, or a liquid jet apparatus used as a precision pipette for emitting a jet of a liquid to be a sample. Further, the liquid jet apparatus can be a liquid jet apparatus for emitting a jet of lubricating oil to a precision machine such as a timepiece or a camera in a pinpoint manner, a liquid jet apparatus for emitting on a substrate a jet of a liquid of transparent resin such as ultraviolet curing resin for forming a fine hemispherical lens (optical lens) used for an optical communication device, a liquid jet apparatus for emitting a jet of an etching liquid of an acid or an alkali for etching a substrate or the like, a fluid jet apparatus for emitting a gel jet, or a fluid jet recording apparatus for emitting a jet of a solid substance including fine particles such as a toner as an example. Further, the invention can be applied to either one of these jet apparatuses.

What is claimed is:

1. A liquid jet apparatus comprising:
   a drive waveform generator adapted to generate a drive waveform signal;
   a modulator adapted to execute pulse modulation on the drive waveform signal;
   a digital power amplifier adapted to power-amplify the modulated signal, on which the pulse modulation is executed by the modulator;
   a low pass filter adapted to smooth the amplified digital signal obtained by the power-amplification of the digital power amplifier; and
   a modulation period modification circuit adapted to modify a modulation period of the pulse modulation of the modulator,
   wherein the modulation period modification circuit configured to modify a carrier frequency of a PWM modulated signal of the modulator in accordance with a gradient of a potential of the drive waveform signal.

2. The liquid jet apparatus according to claim 1,
   wherein the modulation period modification circuit configured to modify the carrier frequency of the PWM modulated signal when the gradient of the drive waveform signal is not zero.

3. The liquid jet apparatus according to claim 1,
   wherein the modulation period modification circuit configured to raise the carrier frequency of the PWM modulated signal when the potential of the drive waveform signal varies.

4. The liquid jet apparatus according to claim 1,
   wherein the drive waveform generator stores a carrier frequency data of the PWM modulated signal of the modular, the carrier frequency data being arranged so that the carrier frequency of the modulated signal is raised when the potential of the drive waveform signal varies.

5. A driving method of a liquid jet apparatus which having a drive waveform generator adapted to generate a drive waveform signal; a modulator adapted to execute pulse modulation on the drive waveform signal; a digital power amplifier adapted to power-amplify the modulated signal, on which the pulse modulation is executed by the modulator; and a low pass filter adapted to smooth the amplified digital signal obtained by the power-amplification of the digital power amplifier, the method comprising:
   adjusting a carrier frequency of a PWM modulated signal of the modulator in accordance with a gradient of the potential of the drive waveform signal.

6. The driving method of the liquid jet apparatus according to claim 5, wherein
   the carrier frequency of the PWM modulated signal is adjusted when a gradient of the drive waveform signal is not zero.

7. The driving method of the liquid jet apparatus according to claim 5, wherein
   the carrier frequency of the modulated signal is adjusted when the potential of the drive waveform signal varies.

* * * * *